United States Patent
Gundlac

[15] 3,678,850
[45] July 25, 1972

[54] POROUS PRINTING PLATE PREPARED FROM PARTICULATE PHOTOSENSITIVE RESINOUS MATERIAL

[72] Inventor: Robert W. Gundlac, Victor, N.Y.

[73] Assignee: Xerox Corporation, Rochester, N.Y.

[22] Filed: May 2, 1966

[21] Appl. No.: 546,823

[52] U.S. Cl. ....................................101/170, 96/33, 96/35, 101/401.1

[51] Int. Cl. ....................................B41m 1/10, G03f 7/02

[58] Field of Search ................96/33, 35, 90 PC, 115 P, 115; 101/170, 401.1

[56] References Cited

UNITED STATES PATENTS

| | | | |
|---|---|---|---|
| 2,956,878 | 10/1960 | Michiels et al. | 96/33 |
| 3,100,702 | 8/1963 | Rauner et al. | 96/33 |
| 2,690,966 | 1/1951 | Minsk et al. | 95/7 |
| 3,297,440 | 1/1967 | Delzenne | 96/35.1 |
| 3,346,385 | 10/1967 | Foris | 96/36 |
| 2,835,656 | 5/1958 | Unruh et al. | 260/78.5 |
| 3,353,955 | 11/1967 | Colgrove | 96/28 |
| 3,155,513 | 11/1964 | Sorensen | 96/91 |
| 3,019,106 | 1/1962 | Adams | 96/48 |

FOREIGN PATENTS OR APPLICATIONS

| | | | |
|---|---|---|---|
| 168,578 | 6/1922 | Great Britain | 96/35 |
| 566,795 | 1/1945 | Great Britain | 96/35.1 |

*Primary Examiner*—George F. Lesmes
*Assistant Examiner*—M. B. Wittenberg
*Attorney*—Stanley Z. Cole and James J. Ralabate

[57] ABSTRACT

This application pertains to a porous printing plate prepared from particulate photosensitive resinous material. Upon exposure to actinic radiation in an imagewise manner, the melting temperature of the exposed areas of the photosensitive resin is increased so that when the final plate is heat treated, the image areas maintain their porous properties. Ink is then applied and as a result of capillary action transferred upon contact from the image areas to a copy sheet.

20 Claims, 12 Drawing Figures

PATENTED JUL 25 1972 3,678,850

INVENTOR.
ROBERT W. GUNDLACH
BY James J. Ralabate
ATTORNEY

INVENTOR.
ROBERT W. GUNDLACH

BY James J. Ralabate

ATTORNEY

POROUS PRINTING PLATE PREPARED FROM PARTICULATE PHOTOSENSITIVE RESINOUS MATERIAL

This invention relates to an imaging system, and more specifically to an improved printing system.

A number of techniques are known whereby master plates may be produced for subsequent use in printing processes. For example, lithographic printing utilizing a master is a well known and established process. In general, lithography is a method of printing from a flat plate which depends upon different properties of the image and non-image areas for printability. In conventional lithography, the non-image area is hydrophilic while the image area is hydrophobic. The printing master is first contacted with a fountain solution which wets all portions of the surface not covered by the hydrophobic image. An oil based printing ink is then applied to achieve the desired selective inking in the image areas. Generally, the ink image on the master is then transferred to an offset roller from where the actual printing takes place. Adherography is a method of duplicating whereby copy material in the form of an image will selectively absorb infrared radiation. Heat is radiated in the image areas thereby producing selective softening of an underlying transfer sheet containing a volatile transfer material and permitting transfer of the volatile or tacky material to a copy sheet in imagewise configuration. It is then necessary to develop the transferred image with a dry powder. Letterpress printing is a form of printing whereby a relief or raised image is formed, usually by an etching process, above the flat reference surface of the printing plate. The raised and subsequently inked image areas of the plate are contacted with a copy sheet.

While these and other techniques have been found useful for producing printing masters, there are inherent disadvantages to their use. In particular, either the technique for producing the master is itself overly complex and expensive, or there results a master which is difficult to use and gives inferior printing. For example, in the case of the letterpress master, the required etching process is considerably involved and time consuming, requiring strict control measures to produce the desired results. In lithography, on the other hand, while simplifying production of masters there are basic disadvantages which make this method of printing undesirable. For example, it is ordinarily required that a conversion solution be used to convert the usually initial hydrophobic background to one having hydrophilic properties, so that it will not accept the oil based ink during the inking phase of the process. Furthermore, a second disadvantage to this system is that it is generally necessary to transfer the ink image of the master to an offset roller from which the actual printing takes place, therefore, introducing an intermediate step into the printing process which ordinarily substantially affects the resolution of the printed image. A further disadvantage is that it is difficult to maintain the proper water-to-ink balance during the printing phase of the process. The adherography method of printing also presents several disadvantages. One disadvantage, for example, is that it is necessary to employ a transfer sheet containing a volatilizable imaging material during the imaging phase of process. A second disadvantage to this system is that additional developing, cleaning and image fixing steps are required following the image transfer phase of the printing process.

It is therefore, an object of this invention to provide an imaging system which will overcome the above-noted disadvantages.

It is a further object of this invention to provide a process of using a novel printing plate.

Another object of this invention is to provide a novel method for the preparation of a printing master.

Still a further object of this invention is to provide a novel printing plate wherein the properties of the materials used to prepare the plate need not be altered before printing.

Yet, still a further object of this invention is to provide a novel printing plate from which prints may be obtained by a continuous one step process.

The foregoing objects and others are accomplished in accordance with this invention, generally speaking, by providing a printing plate prepared by bonding to the surface of a suitable substrate a porous, ink-retaining photosensitive resin, the melting temperature of which may be altered by exposure to intense radiation with actinic energy. The porous plate is formed by overcoating a supporting base, such as paper, with a relatively thin layer of a low melting point thermoplastic material, such as polyethylene, and subsequently dusting or applying to the surface of the thermoplastic resin a particulate photosensitive resin material. The photosensitive resin is such that upon exposure to actinic radiation, the melting point of the material is increased substantially above its initial value. The photosensitive resinous layer is then treated in a manner, such as by heating, so as to partially fuse it to the underlying substrate without destroying the porosity of the photosensitive resin. The porous photosensitive layer is next exposed to actinic radiation through a pattern of light and shadow so as to increase its melting temperature in the irradiated areas. The plate is then further treated so as to gloss over or otherwise destroy the porosity of the non-irradiated areas while completing the bonding of the photosensitive resin to the substrate. It is to be noted that the initial fusing step may be eliminated and that the bonding, glossing, and imaging phases of the process may be accomplished in one operation following exposure of the plate to actinic energy. The plate is then cooled, and ink uniformly applied to the surface thereof. Upon removal of the surplus ink from the surface of the plate, there is retained within the porous, interstitial spaces of the image areas residual ink which upon contact with the selected receiving substrate is released by capillary action from the porous image areas to the receiving substrate. The printing procedure is then repeated until the desired number of copies are produced.

Any suitable photosensitive resin may be used in the course of this invention, the resin being of such a nature that upon exposure to actinic irradiation the melting temperature of the resin will be substantially increased. Typical photosensitive resins are the Staybelite resins, a family of thermoplastic synthetic resins prepared from hydrogenated rosin and commercially available from Hercules Powder Company; styrene polymers such as Velsicol, a styrene terpolymer available from the Velsicol Chemical Corporation; photochromic materials such as the spiropyrans, sydnones hydrazones and stilbene derivatives; cinnamic acid esters, such as those disclosed in U.S. Pat. Nos. 2,670,285 and 2,670,287; polyvinyl carbazole; and systems comprising a non-photosensitive polymer and a photosensitive polymer with which the former is capable of reacting on exposure to the radiation. Polymeric materials, such as casein and rubber, in combination with a photosensitive azidostilbene sulfonate derivative, such as described in U.S. Pat. No. 2,848,328, is illustrative of this system. A system such as is described in U.S. Pat. Nos. 2,760,863 and 2,791,504 comprising a monomer, a dimer, and/or a low molecular weight polymer with a filler, and one or more polymerization catalysts, polymerizes and becomes sensitive to actinic radiation and therefore useful in the present invention. Non-photoconductive polymers such as ethyl cellulose, and polymethyl methacrylate, when exposed to light in the presence of a photosensitive chalcone or unsaturated ketone derivatives, as is more fully illustrated in U.S. Pat. No. 2,544,905, exhibit the necessary properties required by the process of the present invention. Preferred are the Staybelite resins, polyvinyl carbazole, Velsicol, the cinnamic acid esters, and the photochromic materials due to their ease in handling.

Any suitable material may be used as the supporting base of the present invention. The base may be of a rigid or non-rigid material. The primary requirement in the selection of the support base of the present invention is that the combination of photosensitive resin and base be such that the two essential results of the invention may be carried out, that is, the partial cohesion, each to the other, of the photosensitive resin particles and the forming, by adhesion, of a bond between the mass of the partially fused resin and the base. The latter effect is generally realized as a result of the presence of the thermoplastic coating interposed between the photosensitive resin and the base. However, the photosensitive resin may be so selected such that it will provide its own adherent bond to a relatively inert substrate, thereby eliminating the necessity of the thermoplastic overcoating. Typical types of bases are zinc, aluminum, glass, brass, polyethylene, polypropylene, Mylar, the latter being a polyethylene terephthalate resin available from E.I. du Pont de Nemours and Company, thermosetting resins such as urea formaldehyde and epoxy resins, and ordinary bond paper. For purposes of this invention, polyethylene, polypropylene, Mylar, and ordinary bond paper are preferred as the support base due to their inherent flexibility property.

Any suitable means may be used to fix the photosensitive resinous material of the present invention to the underlying substrate in a manner conforming to the requirements of the present invention. For example, the fusing procedure may be carried out by heat applied by a conventional hot plate or by exposure to solvent vapors, as is more fully described in U.S. Pat. No. 3,140,160, either technique of which will produce the necessary effect required by the present invention. The net result of the fusing operation is to form within the mass of the exposed and partially fused photosensitive resinous area a large number of interstitial spaces which serve to retain ink for future printing while the unexposed areas collapse to form glossy, impervious areas. The ink is transferred from the surface of the printing plate to a copy sheet by way of capillary action in response to pressure applied upon the copy sheet when contacted with the surface of the printing plate. It is preferred that the fixing phase of the process be carried out by a heating source in order to maintain maximum control over this phase of the procedure. The use of heat is very reliable in that it can be uniformly applied. The amount of heat required is dependent upon the melting temperature of the photosensitive resin and thermoplastic overcoating materials being used.

Any suitable low melting thermoplastic overcoating may be used in the course of this invention. The choice of the particular composition is governed by the photosensitive resin selected inasmuch as both should be fusible by the heat source utilized and both should have relatively similar melting temperatures. Typical thermoplastic materials are Nevillac, an alkyl hydroxy resin commercially available from Neville Chemical Co.; Piccolastic resins, styrene polymers available from Pennsylvania Industrial Chemical Corporation; VYNS, a vinyl chloride-acetate resin commercially available from Union Carbide Company; polyethylene; polyvinylchloride, and other thermoplastic materials such as waxes, that will satisfy the requirements of the present invention. The presence of the overcoating thermoplastic material assures a high degree of adhesion between the photosensitive resin and the underlying base. When heat is used as the fixing means, it is generally preferred that the thermoplastic layer have a melting point slightly lower than the photosensitive resinous material so that upon the application of heat, the thermoplastic layer will soften slightly in advance of the photosensitive resin, thereby assuring that formation of a bond between the resin and the support base is not critically dependent upon the duration of heating of the photosensitive resin. When fusing in the presence of solvent vapors, such as trichloroethylene vapors, it is desirable to select a thermoplastic resin which will soften slightly in advance of the photosensitive resin for similar reasons as stated above.

Any conventional and/or suitable commercially available ink may be used in the process of this invention. These generally comprise either a water or oil soluble dye dissolved in a water or oil carrier depending upon the dye. Typical dye substances are methylene blue, available from Eastman Kodak, brilliant yellow, available from Harlaco Chemical Company, potassium permanganate, ferric chloride, cobaltous chloride available from Dayco Laboratories and methyl violet, rose bengal and quinoline yellow, the latter three available from The Allied Chemical Company. Furthermore, the pigmented inks may also be utilized in the course of the present invention. Typical pigments are carbon black, titanium dioxide, white lead, zinc oxide, zinc sulfide, iron oxide, chromium oxide, lead chromate, zinc chromate, cadmium yellow, cadmium red, red lead, antimony dioxide, magnesium silicate, calcium carbonate, calcium silicate, phthalocyanines, benzidines, dinitrenilines, naphthols, and toluidines. The pigmented inks are preferred in the present invention inasmuch as the final reproduced prints are longer lasting and possess optimum optical density characteristics. When employed it is desirable to minimize the particle size of the pigmented inks in order to expedite imaging. Specifically, preferred among the pigments is carbon black because it is more suitable for most printing operations.

Inasmuch as the printing capabilities of the present invention are derived from the presence of multiple interstitial spaces which act as tiny reservoirs for the printing ink, the depth of the photosensitive resin particles will have a bearing upon the print produced. Generally, the depth of the particles may range from about 5 to about 200 microns. In order to obtain optimum results, it is preferred that the thickness of the photosensitive resin layer be approximately 15 to 100 microns. It is also desirable that the particle size of the photosensitive resin average from about 1 to about 50 microns in diameter. In order to get maximum efficiency from the partially fused resinous material, it is preferred that the diameter of the resin particles range from about 5 to 20 microns.

The invention is illustrated in the accompanying drawings in which.

Figure 12:
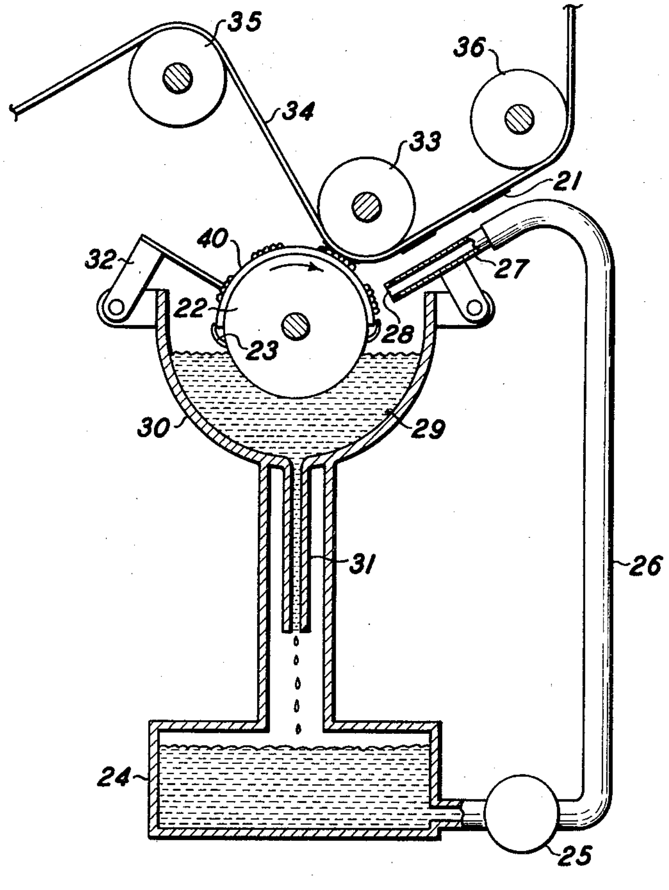

FIG. 12 diagrammatically illustrates a rotatable gravure type printing press utilizing the plate prepared pursuant to the present invention.

Figure 1:
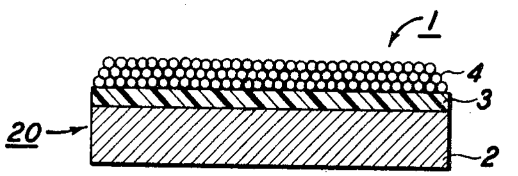
FIG. 1 is a sectional view of the printing plate of the present invention prior to the preliminary fusing of the photosensitive resin to the underlying substrate.

In the present process for preparing a printing master, a printing plate 1, illustrated in FIG. 1 which consists of a substrate 20 comprising a support base 2 and a thermoplastic overcoating 3 is dusted with a photosensitive resinous material 4 approximately about 5 to 200 microns thick. It is necessary that the resinous material deposited be of sufficient depth such that it is capable of retaining ink which is to be subsequently transferred in an image-wise configuration to a copy sheet during the printing phase of the process of the present invention. For maximum efficiency, it is preferred that the resin depth be from about 15 to 100 microns. A uniform coating of the photosensitive resinous material is obtained in accordance with the process as set out in U.S. Pat. No. 2,618,522. As described in that process, the resinous developer particles are dusted onto the surface of the overcoated plate, in the presence of a granular carrier, the plate having previously been electrically charged. The process as defined therein provides for an even distribution of the resinous material over the surface of the overcoated plate.

Figure 2:
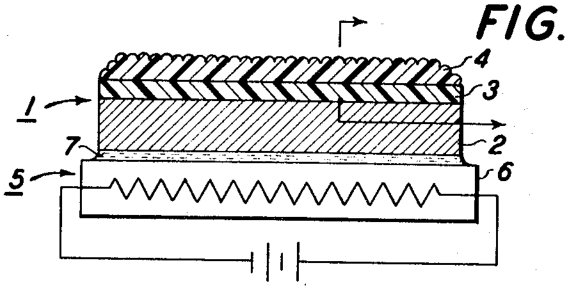
FIG. 2 is a sectional view of the plate of the present invention following the preliminary partial fusing of the photosensitive resin.
Figure 3:
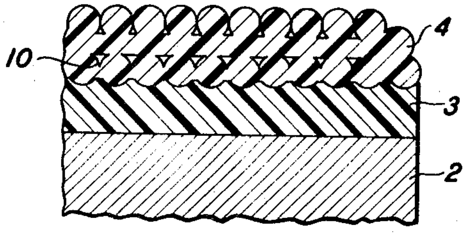
FIG. 3 is a magnified view of the partially fused plate of FIG. 2.

FIG. 2 illustrates the first fusing step whereby the photosensitive resin 4 on the surface of plate 1 is partially fused by heat supplied from heat source 5. The latter may comprise a hot plate 6 positioned under the supporting base 2 with an intervening layer of water 7, inserted to insure good thermal contact. The fusing is allowed to proceed, as will be more fully explained hereafter, to a point where both softening of the thermoplastic overcoating 3 and the photosensitive resin 4 occurs, to a degree so as to bond the photosensitive resin and thermoplastic overcoating to the base 2 and to partially fuse the resinous material 4 but not to the extent of destroying the porous nature of the photosensitive material. FIG. 3 illustrates a magnified section of the partially fused photosensitive resin 4 to itself and the underlying thermoplastic overcoating 3 without destroying the porosity of the surface of the plate 1. The plate in this form is relatively stable and may be handled and stored. However, if stored, it is desirable that the plate be kept in an area free from exposure to actinic radiation.

Figure 4:
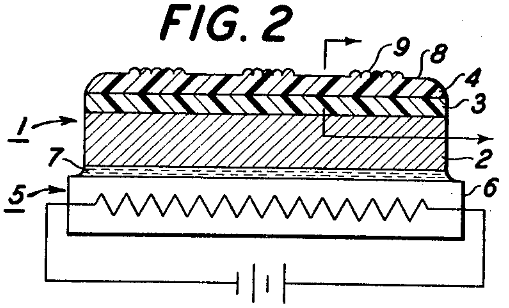
FIG. 4 is a sectional view of the plate of the present invention illustrating the glossing effect produced by the application of heat subsequent to exposure to actinic irradiation.
Figure 5:
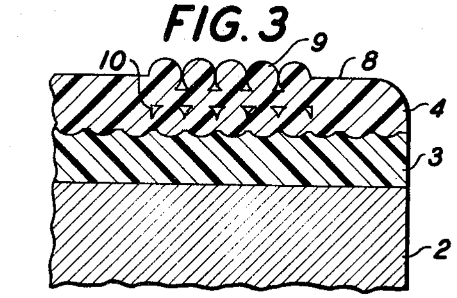
FIG. 5 is a magnified view of the heat treated plate of FIG. 4.

Following the initial heating step whereby the surface of the printing plate is partially fused, the photosensitive resinous layer is exposed to a pattern of light and shadow whereby the melting point of the exposed area is raised above that of the non-exposed areas. FIG. 4 illustrates the effect obtained when the printing plate 1 is heated for a second time following the exposure step. The non-exposed areas 8 of the photosensitive resinous layer 4, not undergoing any change in melting characteristics, are glossed over as a result of the second heating step. The exposed areas 9 of the photosensitive resinous layer 4 not having been affected by the repeated heating of the plate 1 maintain their porosity. FIG. 5 illustrates a magnified section of the plate of FIG. 4 demonstrating the glossed areas 8 and porous areas 9 of the resinous layer 4 with interstitial spaces 10.

Figure 6:
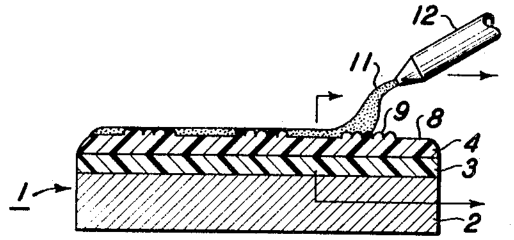
FIG. 6 is a sectional view of the printing plate of the present invention bearing a porous, ink receptive image partially developed.
Figure 7:
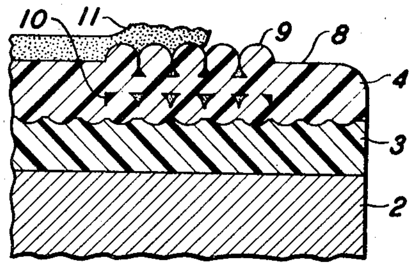
FIG. 7 is a magnified view of the partially developed porous image of FIG. 6.

FIG. 6 illustrates the inking procedure whereby a water base ink 11 from a source 12 is uniformly applied to the surface of plate 1. FIG. 7 illustrates a magnified section of the plate of FIG. 6. The ink 11 is coated over both the glossed areas 8 and the porous, non-glossed areas 9 and fills the interstitial spaces 10 of the porous areas.

Figure 8:
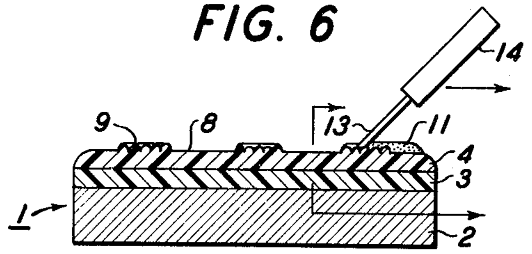
FIG. 8 is a sectional view of the image bearing plate of the present invention illustrating the removal of ink from the non-image areas.
Figure 9:
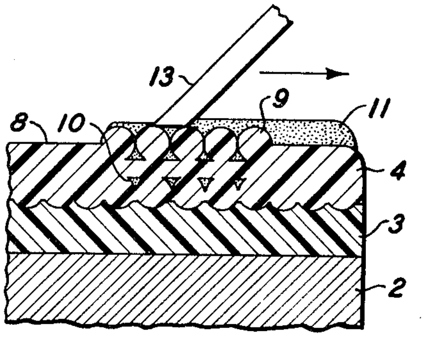
FIG. 9 is a magnified view of the developed image of FIG. 8.

FIG. 8 illustrates the removal of the excess ink from the surface of the printing plate by a rubber blade 13 of a squeegee 14 which is passed over the plate surface. FIG. 9 illustrates a magnified section of the partially squeegeed plate of FIG. 8 demonstrating the removal of the ink from the glossed areas 8 and retention of the ink by the porous areas 9 on the surface and in the interstitial spaces 10.

Figure 10:
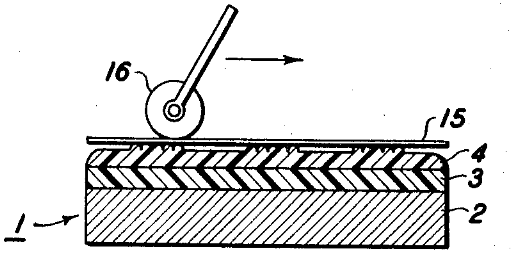
FIG. 10 is a sectional view of the developed printing plate of the present invention in contact with a copy sheet.
Figure 11:
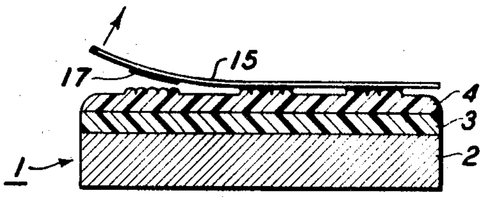
FIG. 11 is a sectional view of the printing plate of the present invention with the image bearing copy sheet partially removed therefrom.

A copy sheet 15 is applied to the surface of the plate 1 in FIG. 10 and a roller 16 is directed across the back of the copy sheet as indicated by the arrow so as to effect, as a result of pressure applied to the roller, a transfer of the ink developed image from the surface of plate 1 to the surface of the copy sheet 15. FIG. 11 illustrates the removal of the copy sheet 15 from the surface of plate 1 in the direction indicated by the arrow with the transferred image 17 adhering to the under surface of the copy sheet 15. The plate 1 is now ready for reuse in the printing cycle.

FIG. 12 illustrates a complete rotogravure type press utilizing a printing plate prepared according to the present invention. For purposes of illustration only, the printing plate is considered to be shown at 40, as a printing master similar to that described in connection with FIG. 8. The master 40 is clamped to a rigged rotating cylinder 22 by a clamping means 23. As the cylinder rotates in the direction indicated, the ink from reservoir 24 is forced by pump 25 through the conduit 26 and inking spout 27 to discharge from orifice 28 upon the rotating master-bearing cylinder. The ink coated master then rotates through a secondary ink bath 29, formed within base 30 as a result of limited drainage from ink exit conduit 31. The ink coated master then passes under a blade holder 32. Thereafter, in the continuing rotation of the cylinder, the ink master passes under impression cylinder 33 where it contacts and prints image 21 upon the copy sheet web 34. Web rollers 35 and 36 guide the copy sheet web through the compression cylinder and maintain the desired degree of tautness.

To further define the specifics of the present invention, the following examples are intended to illustrate and not limit the particulars of the present system. Parts and percentages are by weight unless otherwise indicated. The examples are also to illustrate various preferred embodiments of the present invention.

EXAMPLE I

Velsicol X-37, a styrene terpolymer, available from the Velsicol Chemical Corporation, is pulverized in a morter and pestle until the particle size averages about 10 microns in diameter. An aluminum plate is then brush coated with a layer of VYNS, a vinyl chloride-acetate resin commercially available from Union Carbide Co., at a thickness of about 10 microns. The plastic coated aluminum plate is charged to about +300 volts by means of a laboratory corotron unit powered by a high voltage power supply. The charging time is 0.1 of a milliamp at 7,500 volts. The pulverized Velsicol resin is cascaded between the surface of the charged plate and a development electrode in the presence of a 100 mesh ammonium chloride carrier at a 1:1 ratio in order to provide for a uniform layer of the resin material about 3 particles in thickness. The plate is then heated to a temperature of about 110° C. by means of a hot plate for about 30 seconds so as to bond the photosensitive resin and thermoplastic overcoating to the aluminum substrate and partially fuse the resin particles each to the other. The surface of the plate is then exposed to ultra-violet radiation through a transparent positive USAF test chart with a 75 watt Hanovia lamp. Exposure time is for about 10 minutes. The exposed plate is then heated at a temperature of about 130° C. for about two minutes in order to fuse the unexposed areas to a high gloss. An aqueous crystal violet ink commercially available from The Allied Chemical Co. is then uniformly applied to the surface bearing the porous image and the surplus ink subsequently removed from the glossy areas with a squeegee. The plate is then pressure contacted with a paper transfer sheet, transferring by capillary action the ink in imagewise configuration from the porous image areas of the plate to the paper.

EXAMPLE II

The process of preparing a printing master as described in Example I is repeated excepting the prepared printing plate is exposed to u.v. radiation for approximately 18 minutes. The density of the image produced is increased over that of Example I indicating that increased exposure time will correspondingly yield a superior print.

EXAMPLE III

The process of preparing a printing master as described in Example I is repeated excepting the prepared printing plate is exposed to u.v. radiation for approximately 6 minutes. The results of this test run further substantiated the conclusion drawn in Example II.

EXAMPLE IV

The procedure of Example I is repeated excepting the initial heating step is eliminated. The prints obtained although acceptable are lacking in quality as compared to those obtained in Example I, inasmuch as the resolution and density of the image in the first instance is more definite.

EXAMPLE V

The procedure of Example I is repeated excepting polyvinyl carbazole is used in place of the Velsicol X-37 photosensitive resin and the overcoating thermoplastic resin is polyethylene of a molecular weight of about 6000. The initial heating step is carried out at a temperature of 90° C. and the final heating step at a temperature of 110° C. The printing results obtained in this instance are comparable to those of Example I.

EXAMPLE VI

The process of preparing a printing master as described in Example V is repeated excepting the prepared printing plate is exposed to u.v. radiation for approximately 18 minutes. The results obtained are similar to those of Example II.

EXAMPLE VII

The procedure of Example V is repeated excepting the initial heating step is eliminated. The results obtained are similar to those of Example IV.

Although the present examples are specific in terms and conditions and materials used, any of the above listed typical materials may be substituted when suitable in the above examples with similar results. In addition to the steps used to prepare the printing plate of the present invention, other steps or modifications may be used, if desirable. For example, in lieu of the above mentioned continuous substrate materials, if the porous, photosensitive resin is formed on a porous substrate, ink may be supplied during the inking phase of the process through the substrate side of the plate as in stencil duplicating. In addition, other materials may be incorporated in the photosensitive resin, overcoating material, substrate or plate which will enhance, synergize, or otherwise desirably effect the properties of these materials for the present use. For example, the sensitivity of the photosensitive resin of the present invention may be increased by the inclusion of additional sensitizing agents therein.

Anyone skilled in the art will have other modifications occur to him based on the teachings of the present invention. These modifications are intended to be encompassed within the scope of this invention.

What is claimed is:

1. A method for preparing a porous printing master which comprises bonding to the surface of a substrate a particulate photosensitive resin such that there is produced a multiple of porous interstitial spaces capable of acting as reservoirs, said resin having a melting temperature which may be altered upon exposure to actinic radiation, exposing said resin to a pattern of said actinic radiation thereby increasing the melting temperature of said resin in said irradiated areas and exposing said irradiated resin to an environment which destroys the porous reservoirs of the non-irradiated areas and maintains the porosity of the irradiated areas of said resin to produce said printing master.

2. The process as defined in claim 1 wherein said substrate comprises a support base having fixed to the surface thereof a thermoplastic resin.

3. The process as defined in claim 2 wherein said thermoplastic resin comprises polyethylene.

4. The process as defined in claim 1 wherein said particulate photosensitive resin comprises a member selected from the group consisting of photochromics, cinnamic acid esters, polyvinyl carbazole, styrene terpolymers and mixtures thereof.

5. The process as defined in claim 4 wherein said particulate photosensitive resin comprises polyvinyl carbazole.

6. The process as defined in claim 4 wherein said particulate photosensitive resin comprises a cinnamic acid ester.

7. The process as defined in claim 4 wherein said particulate photosensitive resin comprises a photochromic.

8. The process as defined in claim 4 wherein said particulate photosensitive resin comprises a styrene terpolymer.

9. The process as disclosed in claim 1 wherein said particulate photosensitive resin ranges in particle size diameter from about 1 to about 50 microns.

10. A method of preparing a porous printing master which comprises depositing on the surface of a substrate a particulate photosensitive resin in such a manner such that there is produced a multiple of porous interstitial spaces capable of acting as reservoirs, said resin having a melting temperature which may be altered upon exposure to actinic energy, heating said substrate bearing said photosensitive resin so as to partially bond said resin to said substrate, exposing said photosensitive resin to a pattern of light and shadow until the melting temperature of said resin is increased in the irradiated areas, reheating the substrate bearing the photosensitive resin to destroy the porous reservoirs of the non-irradiated areas of said resin while not effecting the porous ink retaining image areas, and cooling to form said printing master.

11. The process as defined in claim 10 wherein said photosensitive resin is deposited on the surface of said substrate at a depth of from about 5 to 200 microns.

12. The process as defined in claim 10 wherein said substrate comprises a support base having fixed to the surface thereof a low melting point thermoplastic synthetic resin.

13. The method as disclosed in claim 10 wherein said particulate photosensitive resin ranges in diameter from about 1 to about 50 microns.

14. A method of preparing a copy of a graphic original which comprises providing a porous member comprising a substrate having superimposed thereon a particulate photosensitive resin in a manner such that there is produced a multiple of porous interstitial spaces in the form of reservoirs, selectively exposing said graphic original to said particulate photosensitive resin with actinic radiation thereby increasing the melting temperature of said resin in the exposed areas, heating said resin to a temperature sufficient to cause softening of said resin in the unexposed areas thereby destroying the porous interstitial spaces of said resin in said unexposed areas while not effecting the porous nature of the resin in the exposed areas, applying ink to the surface of said imaged resin such that said ink is distributed thereon comforming to the remaining porous image areas and contacting said inked surface with a copy sheet thereby transferring ink from said remaining reservoirs to said copy sheet in an imagewise configuration.

15. The process as disclosed in claim 14 wherein said inking and transferring steps are repeated at least more than once.

16. The process as disclosed in claim 14 wherein said particulate photosensitive resin ranges in diameter from about 1 to about 50 microns.

17. The process as defined in claim 14 wherein said photosensitive resinous layer comprises a member selected from the group consisting of photochromics, cinnamic acid esters, polyvinyl carbazole, styrene terpolymers and mixtures thereof.

18. A porous printing plate comprising a base substrate having bonded to the surface thereof, a low melting point, thermoplastic coating, said coating having superimposed thereon a resinous layer having fixed therein a porous ink retaining image comprising a multiple of interstitial spaces in the form of reservoirs.

19. The porous printing plate as described in claim 18 wherein said resinous layer is selected from at least one member of the group consisting of photochromics, cinnamic acid esters, polyvinyl carbazole and styrene terpolymers.

20. The porous printing plate as defined in claim 18 wherein said base substrate is aluminum and said resinous layer comprises polyvinyl carbazole.

* * * * *